United States Patent
Peng et al.

(10) Patent No.: US 10,728,060 B2
(45) Date of Patent: Jul. 28, 2020

(54) TWO-STEP FEED-FORWARD EQUALIZER FOR VOLTAGE-MODE TRANSMITTER ARCHITECTURE

(71) Applicants: Chu-Yun Peng, Taoyuan (TW); Chia-Hao Shih, Taipei (TW)

(72) Inventors: Chu-Yun Peng, Taoyuan (TW); Chia-Hao Shih, Taipei (TW)

(73) Assignee: Teletrx Co., Taipei (TW)

( * ) Notice: Subject to any disclaimer, the term of this patent is extended or adjusted under 35 U.S.C. 154(b) by 0 days.

(21) Appl. No.: 16/147,493

(22) Filed: Sep. 28, 2018

(65) Prior Publication Data

US 2020/0106649 A1    Apr. 2, 2020

(51) Int. Cl.
*H04L 25/03* (2006.01)
*H03F 3/45* (2006.01)
*H03F 3/19* (2006.01)

(52) U.S. Cl.
CPC ......... *H04L 25/03343* (2013.01); *H03F 3/19* (2013.01); *H03F 3/45475* (2013.01); *H04L 25/03019* (2013.01); *H03F 2200/129* (2013.01); *H03F 2200/451* (2013.01); *H03F 2203/45116* (2013.01); *H03F 2203/45222* (2013.01)

(58) Field of Classification Search
CPC ......... H04L 25/03343; H04L 25/03019; H03F 3/19; H03F 3/45475; H03F 2203/45116; H03F 2200/451; H03F 2203/45222; H03F 2200/129
See application file for complete search history.

(56) References Cited

U.S. PATENT DOCUMENTS

| | | | |
|---|---|---|---|
| 8,432,954 B2* | 4/2013 | Hudson | H04N 21/643 348/512 |
| 8,976,854 B1* | 3/2015 | Healey | H04L 25/03038 375/229 |
| 2012/0147944 A1* | 6/2012 | Amirkhany | H03K 19/0005 375/232 |
| 2012/0187980 A1* | 7/2012 | Kurahashi | H03K 19/018514 326/86 |

* cited by examiner

*Primary Examiner* — Vineeta S Panwalkar
(74) *Attorney, Agent, or Firm* — Chih Feng Yeh; Huntington IP Consulting Co., Ltd.

(57) ABSTRACT

A driver for a transmitter includes an output stage comprising a first equalizer and a second equalizer, coupled to an output circuit of the transmitter, being operable for receiving a plurality of differential input data streams to generate an equalized differential output signals, wherein the first equalizer and the second equalizer being coupled and reconfigured to form a plurality of parallel driver segments, each driver segment having a calibration circuit, at least one of the calibration circuits been enabled to control the impedance of the output circuit, the plurality of differential input data streams are processed by the first and the second equalizer to shape the plurality of differential input data streams for compensating the channel loss.

18 Claims, 9 Drawing Sheets

TWO-STEP FEED-FORWARD EQUALIZER FOR VOLTAGE-MODE TRANSMITTER ARCHITECTURE

BACKGROUND

Technical Field

The present invention relates to an feed-forward equalizer, and more particularly, a two-step feed-forward equalizer for voltage-mode transmitter architecture.

Related Arts

In modern day high-speed serial links with energy efficiency and maintaining high data rates is highly demanding. The continuous development of new networking systems is driven by the need to handle an increasing volume of data traffic. As predicted, the bandwidth requirements of networking and high-performance processing applications will increase greatly. In the near future, for the construction of 5G network and the pervasive migration from local to cloud networking, is pushing the development of the next generation electrical links, expected to reach to an outstanding data-rate of 4100 Gb/s.

Figure 1A:
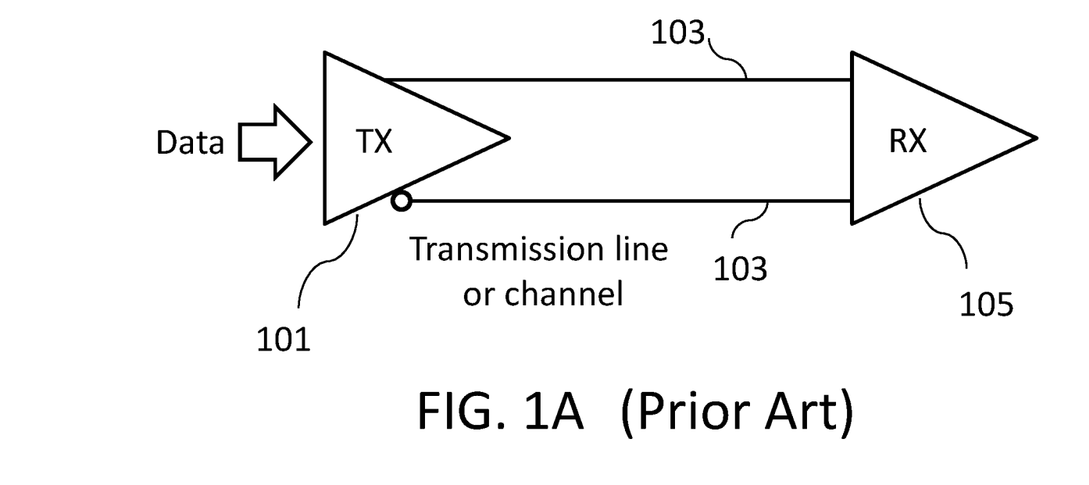
FIG. 1A illustrates a block diagram of communication system for transferring data from a transmitter to a receiver through a pair of transmission lines or channels according a prior art.

Integrated circuits (ICs) typically communicate with one another and other devices using conductive transmission lines (or channels). The conductive transmission lines may take the form of traces on a printed circuit board. At a basic level, in FIG. 1A, a transmitter (TX) 101 sends data over a differential-pair transmission line (channels) 103 to a receiver (RX) 105. When data is sent from an ideal transmitter 101 to a receiver 105 across ideal channels 103, all of the energy in a transmitted pulse will be contained within a single time cell or unit interval (UI).

Figure 1B:
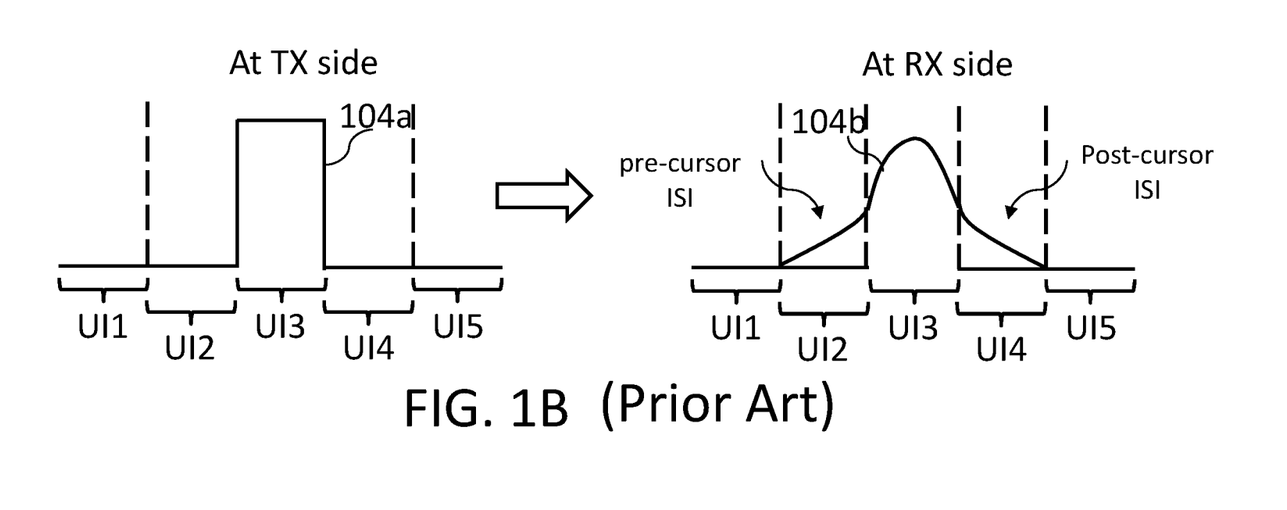
FIG. 1B illustrates the effect of a transmission channel on pulses set across the channel, and in particular shows pre-cursor and post-cursor intersymbol interference (ISI), according to a prior art.

However, process enhancements (e.g., transistor bandwidth) and innovation in I/O circuitry have forced designers to also consider the effects of the transmission channels between the chips on which data is sent. Due to a number of factors, including, for example, the limited conductivity of copper traces, the dielectric medium of the printed circuit board, and the discontinuity introduced by package or connectors, an initially well-defined digital pulse will tend to spread or disperse as it passes through the transmission channel. This is shown in FIG. 1B. As shown, a single pulse of data 104a is sent by the transmitter 101 during a given unit interval (e.g. UI3). However, because of the effect of the channel 103, this data pulse 104b becomes spread over multiple UIs at the receiver 105, i.e. some portion of the energy of the pulse is observed outside of the UI in which the pulse was sent (e.g. in UI2 and UI4). This residual energy outside of the UI of interest may perturb a pulse otherwise occupying either of the neighboring UIs, in a phenomenon referred to intersymbol interference (ISI). As shown, residual energy appearing before the UI of interest (i.e. in UI2) comprises pre-cursor ISI, while residual energy appearing after the UI of interest (i.e. in UI4) comprises post-cursor ISI.

Because ISI can give rise to sensing errors at the receiver, a number of solutions have been proposed to compensate for the effects of ISI. To compensate for signal impairment, a technique called equalization can be applied. Equalization is the process of correcting for the frequency response of the data path. Equalizers are essentially filters that reverse the effects of the transmission channel, meaning that they flatten the frequency response of the path.

Figure 2:
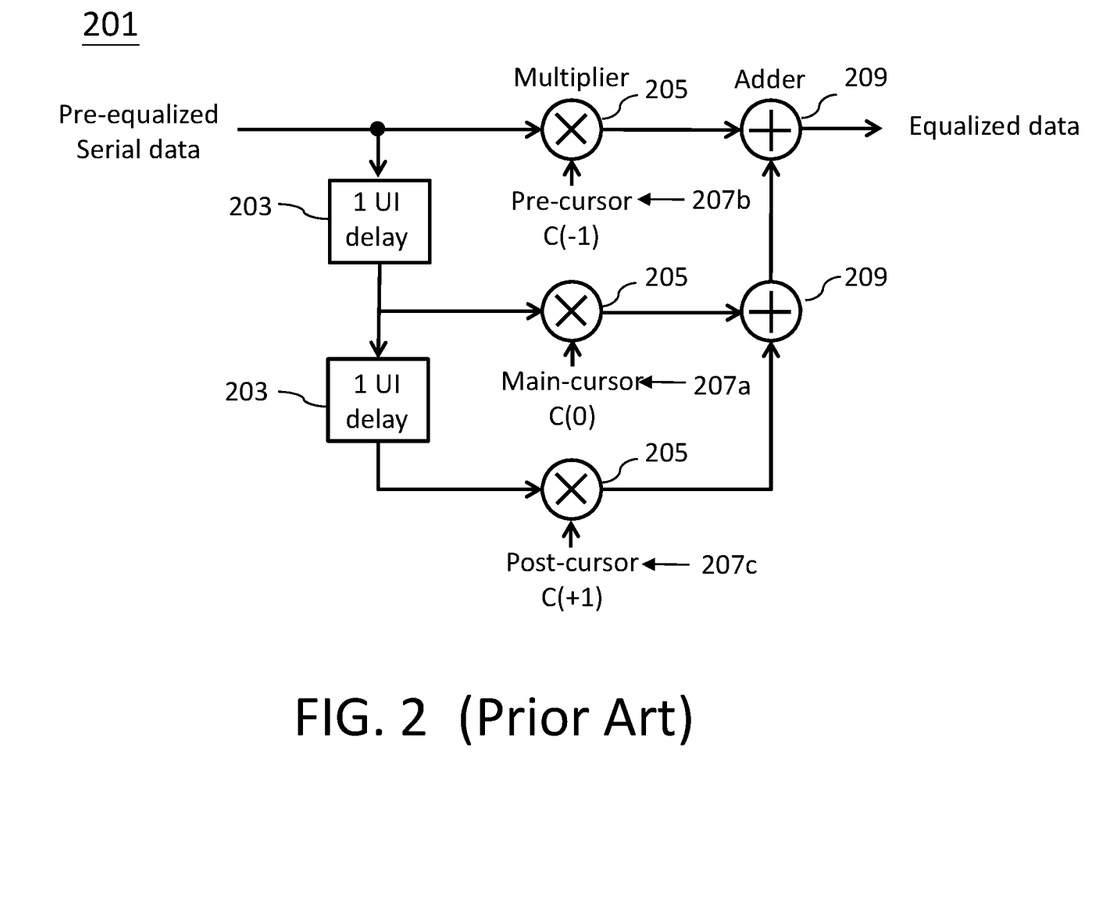
FIG. 2 illustrates a block diagram of a pre-emphasis equalizer circuit according to a prior art.

Equalization is used at either the transmitter or the receiver, or both. The TX equalizer, called a feed-forward equalizer (FFE), is essentially a high-pass filter that pre-distorts the signal in a way to overcome the degradation of the channel. It boosts the signal level at the rise and fall transitions to compensate for the rounding and signal stretching. An example of a TX equalizer is a feed-forward equalization circuit that is usually implemented as a finite-impulse-response (FIR) filter. As shown in FIG. 2, a FFE 201 is usually a FIR filter with coefficient multipliers 205. The delays are one bit time or one UI 203. The values of the coefficients (i.e. cursors) determine the degree of pre-emphasis. These coefficients are initial estimates, as the actual degree of distortion in the signal path is not known. The coefficients values in FIG. 2 are referred as cursors. The main cursor 207a is the voltage at the center of a bit. A pre-cursor 207b is the voltage at the center of the bit before the main bit. A post-cursor 207c is the voltage at the center of the bit after the main bit. The output is the sum of the products of the voltages of bits by an adder 209 occurring prior to the bit of interest. This form of correction involves emphasizing the voltage transitions and de-emphasizing the non-transitions. This technique employs a FIR filter with a series of tap weights programmed to adjust the impulse and, by duality, frequency response. This is the simplest implementation and can be designed entirely in the analogue domain. Such an approach lends itself to very high speed and usually offers relatively low power.

In serial communication system, a large percentage of the total power is consumed in the transmitter, the transmitter often includes equalization to compensate for frequency-dependent loss in the channel. The power dissipation or constraints can also be imposed by routing long differential lanes, in high-speed data transmission, which is becoming one of the most limiting factors in increasing input/output (I/O) density.

Current-mode-logic (CML) style drivers are often employed in the high-speed data transmission because they support high data rates and have an inherently low susceptibility to power supply noise. However, some drawbacks are accompanied, one major disadvantage is its large current consumption. Voltage-mode (VM) driver is an attractive alternative to the CML style driver because it can be ideally four times more power-efficient.

Constructing a transmitter in a modern-day high-speed serial links with energy efficiency and maintaining high data rates is highly demanding, a voltage-mode driver together with equalization techniques architecture is one of the better technical choices. However, once the equalization is applied in the transmitter side, for example feed-forward equalization technique, this approach always sets the equalizer taps' weight via output stage segmentation, which can cause an increasing in an integral circuitry (IC) layout routing about the implementation of transmit equalization with voltage-mode driver and therefore will reduce the I/O bandwidth greatly especially in high data rate circumstance.

To cope the above mentioned issues, a two-step feed-forward equalizer for voltage-mode transmitter architecture is proposed.

SUMMARY

In this invention, a two-step feed-forward equalizer is proposed. A driver for a transmitter includes an output stage comprising a first equalizer and a second equalizer, coupled to an output circuit of the transmitter operable for receiving a plurality of differential input data streams to generate an equalized differential output signals, wherein the first equalizer and the second equalizer being coupled and reconfigured to form a plurality of parallel segments, each driver segment having a calibration circuit, at least one of the calibration circuits been enabled to control the output circuit of the transmitter, the plurality of differential input data streams are processed by the first and the second equalizer to shape the plurality of differential input data streams for compensating the channel loss.

According to one aspect of the invention, the first equalizer and the second equalizer are coupled in parallel to form a two-step feed-forward equalizer for the transmitter.

According to one aspect of the invention, the first equalizer is a coarse feed-forward equalizer containing coarser signal segment levels.

According to one aspect of the invention, the second equalizer is a fine feed-forward equalizer containing finer signal segment levels.

According to one aspect of the invention, the calibration circuit including a first-loop calibration circuit and a second-loop calibration circuit.

According to one aspect of the invention, the first-loop calibration circuit includes a first supply source, a first transistor, a second transistor with its gate coupled to a ground source, a first resistor, a second resistor, and a second supply source serially connected to provide a current path. A first operational amplifier with its output coupled to a gate of the first transistor, its inverting input coupled to a first reference bias, and its non-inverting input connected to a first node between the first resistor and the second resistor. The second-loop calibration circuit includes the first supply source, a third resistor, a fourth resistor, a third transistor with its gate coupled to the first supply source, a fourth transistor, and a third supply source serially connected to provide a current path, wherein the third resistor is the same as the second resistor and the fourth resistor is the same as the first resistor. A second operational amplifier with its output coupled to a gate of the fourth transistor, its inverting terminal coupled to a second reference bias, and its non-inverting input connected to a second node between the third resistor and the fourth resistor.

During the operation of the first sub-circuit, a feedback loop is formed from the output of the first operational amplifier to the first transistor, to the second transistor, to the first resistor, to the first node, and back to the non-inverting input of the first operational amplifier to generate a bias voltage at the first node being about equal to the first reference bias coupled to the inverting input of the first operational amplifier.

During the operation of the second-loop calibration circuit, a feedback loop is formed from the output of the second operational amplifier to the fourth transistor, to the third transistor, to the fourth resistor, to the second node, and back to non-inverting input of the second operational amplifier to generate a bias voltage at the second node being about equal to the second reference bias coupled to the inverting input of the second operational amplifier.

The second supply source in the first-loop calibration circuit and the third supply source in the second-loop calibration circuit are both set to be a ground source respectively.

The first reference bias for the first operational amplifier is set to be a value equal to three quarter of the value of the first supply source, while the second reference bias for the second operational amplifier is set to be a value equal to one quarter of the value of the first supply source.

A data transmitting system includes a transmitter to receive an input binary signal, to process the input binary signal, and out the processed binary signal, wherein the input binary signal consisting of a plurality of differential input data streams. A transmitter circuit included in the transmitter having an output stage including a first equalizer and a second equalizer, coupled an output circuit of the transmitter, being operable for receiving the plurality of differential input data streams to generate an equalized differential output signals, wherein the first equalizer and the second equalizer being coupled and reconfigured to form a plurality of parallel segments, each driver segment having a calibration circuit, at least one of the calibration circuits been enabled to control the output circuit of the transmitter, the plurality of differential input data streams are processed by the first and the second equalizer to shape the plurality of differential input data streams for compensating the channel loss, and a re-timing clock providing a plurality of re-timed signal to the transmitter circuit.

BRIEF DESCRIPTION OF THE DRAWINGS

The components, characteristics and advantages of the present invention may be understood by the detailed descriptions of the preferred embodiments outlined in the specification and the drawings attached.

DETAILED DESCRIPTION

Some preferred embodiments of the present invention will now be described in greater detail. However, it should be recognized that the preferred embodiments of the present invention are provided for illustration rather than limiting the present invention. In addition, the present invention can be practiced in a wide range of other embodiments besides those explicitly described, and the scope of the present invention is not expressly limited except as specified in the accompanying claims.

As mentioned earlier, utilizing a voltage-mode driver together with equalization techniques to construct a transmitter to meet energy efficiency while maintaining high data rates in modern-day high speed serial links applications can be a better technical choice. However, this approach always sets the equalizer taps' weight via output stage segmentation, which can cause an increasing in an integral circuitry (IC) layout routing and can potentially degrade the performance in high data rates circumstance.

For meeting a trend of modern day high-speed data signaling, i.e. to build a serial link system reliably operating above several tens or even above hundred Gb/s, it is required that the transmitter should provide a reliable equalization function known as feed-forward equalization (FFE) with low power consumption. Another important issue for the high-speed links is signal integrity because any reflection is detrimental to the link performance at higher data rates. Therefore, a transmitter driver has become one major contributor to overall performance of the high-speed links. In general, it is not easy to implement a low power driver circuit that provides the FFE function without degrading signal integrity. For this reason, a novel driver topology with FFE implementation, which contains a coarse and fine FFE, is proposed to solve the previous described disadvantages.

In general, the transmitter generates a serial data signal from a parallel data path. The serial data signal has a particular data rate. The transmitter drives the serial data signal onto the transmission medium (e.g. channel) using a digital data modulation technique, such as binary non-return-to-zero (NRZ) modulation or 4-level pulse amplitude modulation (PAM4). A PAM4 refers to a modulator that takes two bits at a time and maps the signal amplitude to one of the four levels. The transmission medium propagates electrical signals representing symbols of the serial data signal (e.g., logic "1" and logic "0") towards the receiver.

Utilizing a differential signaling has an advantage of low common mode noise, which is operated by sending a signal on one wire and the opposite of that signal on a paired wire, the signal information is represented by the difference between the wires rather than their absolute values relative to ground or other fixed reference, therefore the noise caused by the wire (or channel) can be cancelled out and the signal-to-noise ratio (SNR) can be improved.

Figure 3A:
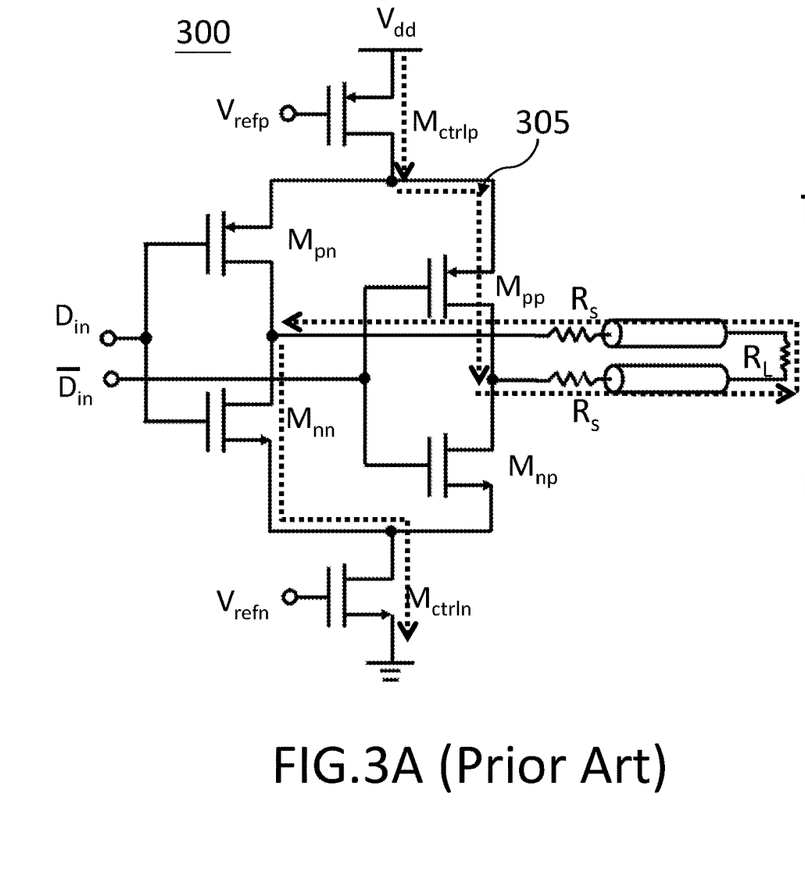
FIG. 3A illustrates an output voltage mode driver for transmitter according to a prior art.

In general voltage-mode transmitter driver acts as a switch selectively connecting to a transmission line. FIG. 3A illustrates a voltage-mode transmitter driver 300 with differential signaling. $D_{in}$ and $\overline{D}_{in}$ represent complementary input data signals respectively, $\overline{D}_{in}$ are active low signals. $D_{in}$ and $\overline{D}_{in}$ together form a differential signaling, $V_{dd}$ represents a supply voltage and $V_{refp}/V_{refn}$ represent the bias for $M_{ctrlp}/M_{ctrln}$, respectively. Driver stage includes a p-type metal oxide semiconductor (PMOS) load transistor $M_{ctrlp}$ and an n-type metal oxide semiconductor (NMOS) load transistor $M_{ctrln}$, each of which produces a relatively stable drive current in response to respective bias voltages $V_{refp}$ and $V_{refn}$. Drive stage additionally includes four drive transistor $M_{pn}$, $M_{nn}$, $M_{pp}$, and $M_{np}$. Where $M_{pn}$ and $M_{pp}$ are PMOS transistors, while $M_{nn}$ and $M_{np}$ are NMOS transistors. If signal $D_{in}$ is a logic "1", signal $\overline{D}_{in}$ should be in logic "0". The signals $D_{in}$ with logic "1" turns on transistor $M_{nn}$, the logic "0" on terminal $\overline{D}_{in}$ turns on transistors $M_{pp}$, transistors $M_{pn}$ and $M_{np}$ are remained off. This operation cause current to flow down through transistors $M_{ctrlp}$ and $M_{pp}$ up through serial resistor $R_s$, terminal load $R_L$ and $R_s$, and down through transistors $M_{nn}$ and $M_{ctrln}$ to ground (see the serious of dotted arrows path 305). Since matching output impedance is required, the voltage-mode driver should have output impedance equal to the characteristic impedance of the transmission lines (or channels).

Conversely, if signal $D_{in}$ is a logic "0", signal $\overline{D}_{in}$ is in logic "1", The signals $D_{in}$ with logic "0" turns on transistor $M_{pn}$, the logic "1" on terminal $\overline{D}_{in}$ turns on transistors $M_{np}$, transistors $M_{pp}$ and $M_{nn}$ are remained off. This operation causes current to flow down through transistors $M_{ctrlp}$, $M_{pn}$, serial resistor $R_s$, terminal load $R_L$, $R_s$, transistor $M_{np}$ and transistor $M_{ctrln}$ to ground.

Figure 3B:
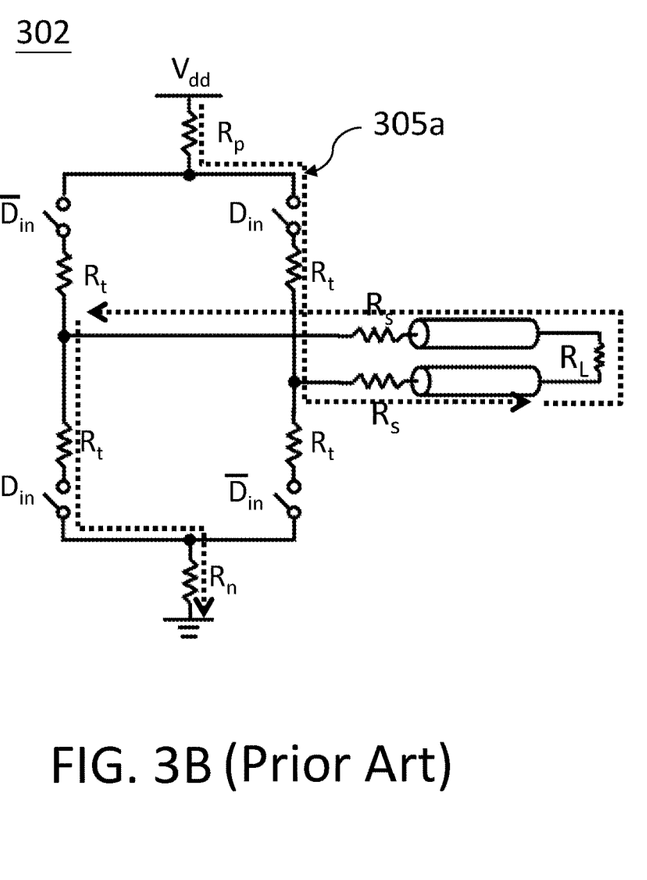
FIG. 3B illustrate an equivalent model that corresponds to the operation of the voltage mode transmitter driver shown in FIG. 3A.

FIG. 3B represents an equivalent model 302 that corresponds to the operation of the voltage mode transmitter driver shown in FIG. 3A. In the equivalent model, $R_t$ models the ON-state resistance of the drive transistors, $M_{pp}$ and $M_{nn}$ for the $D_{in}$ signals route (indicated by the dotted arrow path 305a); in signals route $R_t$ models the ON-state resistance of the drive transistors, $M_{pn}$ and $M_{np}$. $R_p$ and $R_n$ model the ON-state resistance of the load transistors $M_{ctrlp}$ and $M_{ctrln}$, respectively. In the $D_{in}$ ($\overline{D}_{in}$) signals route, transistors $M_{pp}/M_{nn}$ ($M_{pn}/M_{np}$) are biased and sized together with the coupled series resistance $R_p$, $R_s$ and $R_n$ to match the channel characteristic impedance $R_L$.

Figure 3C:
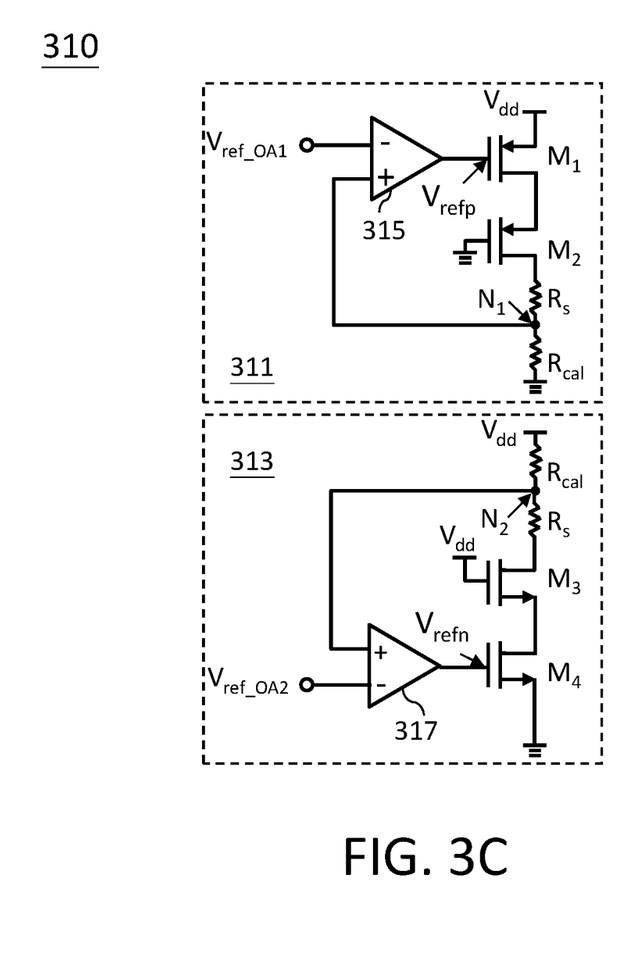
FIG. 3C illustrate a two-loop calibration circuit utilized as a global impedance calibration circuit for the voltage-mode transmitter according to one embodiment of the present invention.

In this invention, a two-loop calibration circuit 310 as shown in FIG. 3C is utilized as a global impedance calibration circuit for FFE, which is a replica driver cell for tuning the impedance of the transistors of transmitter driver and therefore can generate an output impedance tuning to match the impedance of the channel. The two-loop calibration circuit 310 includes a first-loop calibration circuit 311 and a second-loop calibration circuit 313. The first-loop calibration circuit 311 includes transistors $M_1$ (first transistor), $M_2$ (second transistor), a first operational amplifier 315, a first resistor $R_s$, and a second resistor $R_{cal}$. The transistors $M_1$ and $M_2$ are each a PMOS, which respectively represent replica of the transistors $M_{ctrlp}$ and $M_{pp}$ in the circuit shown in FIG. 3A. A source of the transistor $M_1$ is coupled to the common node of power supply $V_{dd}$. A drain of the transistor $M_1$ (first transistor) is coupled to a source of the transistor $M_2$ (second transistor). A drain of the transistor $M_2$ (second transistor) is coupled to one terminal of the first resistor $R_s$. Another terminal of the first resister $R_s$ is coupled to one terminal of the second resistor $R_{cal}$ at a first node $N_1$. A gate of the first transistor $M_1$ is coupled to the output of the first operational amplifier 315. A gate of the second transistor $M_2$ is coupled to a ground source. The common node of power supply $V_{dd}$, the first transistor $M_1$, the second transistor $M_2$ with a gate coupled to ground, the first resistor $R_s$, the second resistor $R_{cal}$, and the ground source serially connected to provide a current path.

The second-loop calibration circuit 313 includes transistors $M_3$ (third transistor), $M_4$ (fourth transistor), a second operational amplifier 317, a third resistor $R_{cal}$, and a fourth resistor $R_s$. The third transistors $M_3$ and the fourth transistor $M_4$ are each an NMOS transistor, which respectively represent replica of the transistors $M_{ctrln}$ and $M_{nn}$ in the circuit shown in FIG. 3A. A source of the fourth transistor $M_4$ is coupled to ground. One terminal of the third resistor $R_{cal}$ is coupled to the common node of the power supply $V_{dd}$. Another terminal of the third resister $R_{cal}$ is coupled to one terminal of the fourth resistor $R_s$. Another terminal of the fourth resistor $R_s$ is coupled to a drain of the third transistor $M_3$. A source of the third transistor $M_3$ is coupled to a drain of the fourth transistor $M_4$. A gate of the transistor $M_4$ is coupled to the output of the second operational amplifier. A gate of the transistor $M_3$ is coupled to the common node of power supply $V_{dd}$. The common node of power supply $V_{dd}$, the third resistor $R_{cal}$, the fourth resistor $R_s$, the third transistor $M_3$ with a gate coupled to the common node of power supply, the fourth transistor $M_4$, and the ground source serially connected to provide a current path.

A non-inverting input of first operational amplifier 315 is coupled between the first resister $R_s$ and the second resistor $R_{cal}$. An inverting input of the first operational amplifier 315 is coupled to a first voltage reference $V_{ref1\_OA1}$ of the first operational amplifier 315.

A non-inverting input of second operational amplifier 317 is coupled between the third resister $R_s$ and the fourth resistor $R_{cal}$. An inverting input of the second operational amplifier is coupled to a second voltage reference $V_{ref2\_OA2}$ of the second operational amplifier 317.

The first voltage reference $V_{ref\_OA1}$ for the first operational amplifier 315 is provided as an input to the inverting input of the first operational amplifier 315. The output of the first operational amplifier 315 with voltage $V_{refp}$ drives the gate of the first transistor $M_1$. The second voltage reference $V_{ref\_OA2}$ for the second operational amplifier 317 is provided as an input to the inverting input of the second operational amplifier 317. The output of the second operational amplifier 317 with voltage $V_{refn}$ drives the gate of the fourth transistor $M_4$.

During operation, the feedback loop from the output of the first operational amplifier 315 to the first transistor $M_1$, the second transistor $M_2$, to the first resistor $R_s$, to the first node $N_1$, and back to the non-inverting input of the first operational amplifier 315 operates to generate a first bias voltage such that the voltage at the first node $N_1$ is about equal to the first voltage reference $V_{ref\_OA1}$ for the first operational amplifier 315.

Similarly, the feedback loop from the output of the second operational amplifier 317 to the fourth transistor $M_4$, to the third transistor $M_3$, to the third resistor $R_s$, to the second node $N_2$, and back to the non-inverting input of the second operational amplifier 317 operates to generate the bias voltage such that the voltage at the second node $N_2$ is about equal to the second voltage reference $V_{ref\_OA2}$ for the second operational amplifier.

In one of the preferred embodiments, the first voltage reference $V_{ref\_OA1}$ for the first operational amplifier 315 is set to be a value of $3/4*V_{dd}$, while the second voltage reference $V_{ref\_OA2}$ for the second operational amplifier 317 is set to be a value of $1/4*V_{dd}$. In this manner, for the circuit 311, the voltage drop from the source of the first transistor $M_1$ to the first node $N_1$ is $1/4 V_{dd}$ and the voltage drop across the resistor $R_{cal}$ is $3/4 V_{dd}$. The on state transistors $M_1$ and $M_2$ can be respectively considered as a resistor, therefore the resistance ratio between the resistance from the source of transistor $M_1$ to node $N_1$ and the resistance $R_{cal}$ is 1/3. Similarly, for the circuit 313, the voltage drop from $R_{cal}$ to the node $N_2$ is $3/4 V_{dd}$ and the voltage drop across $N_2$, transistors $M_4$ and $M_3$ is $1/4 V_{dd}$. The on state transistor $M_4$ and $M_3$ can be respectively considered as a resistor, therefore the resistance ratio between the $R_{cal}$ and the resistance from the node $N_2$ to the source of transistor $M_4$ is 3/1.

In general voltage-mode driver for a transmitter acts as a switch selectively connecting to a transmission line. To match the characteristic impedance of the channels (or transmission lines) for differential signaling, in one embodiment, in the first-loop calibration circuit 311 the resistance for $M_1$, $M_2$, and $R_s$ is set to be n*50Ω, while the resistance of $R_{cal}$ is set to be n*150Ω, where $R_{cal}$ can be realized by either off-chip precise resistor or on-chip variable resistor fixed by a resistor calibration loop; in the second-loop calibration circuit 313 the resistance of $R_{cal}$ is set to be n*150Ω, while the resistance for $M_3$, $M_4$, and $R_s$ is set to be n*50Ω. Where n is the number of total active driver cells.

In general, it is often set the equalizer taps' weight via output stage segmentation to implement equalizer structures for a voltage-mode topologies at the transmitter.

A two-step feed-forward equalizer is proposed as shown in FIG. 4. A FIR block to generate the pre-, main-, post1- and post2-cursor data streams. These pre-, main-, post1- and post2-cursor streams are fed into an output stage 401 and are reconfigured into (pre-, main-), (main-, main-), (post1-, main-), and (post2-, main-) coarse FFE 4110 follow by a 4:1 serializer into a fine FFE 4130. An output stage 401 illustrates the output segments 403a, 403b, 403c and 403d, each output segment having a coarse 4110 (for example, pre- or main-cursor in output segment 403a) and a fine FFE 4130 for equalizing the pre-, main-, post1 and post2 data streams and outputting the equalized data streams through a $D_{out}$ terminal. The coarse FFE 4110 and the fine FFE 4130 are coupled through a 4:1 serializer to form a two-step FFE. The fine FFE 4130 is always enabled and has finer signal segment levels compared to the coarse FFE. The fine FFE 4130 contains the maximum impedance value in order to refine the calibration accuracy.

For the rapid growth of communication demands and development of communication technology accelerate the continued evolution of data transmission in the networking system. NRZ and PAM4 modulation play important roles in this challenge.

Non-return to zero (NRZ) uses two amplitude levels to represent binary code 0 and 1. It contain one bit information per symbol. Four-level pulse amplitude modulation (PAM4) uses four distinct amplitude to convey the information. The amplitude levels 0, 1, 2, 3 are expressed by two consecutive bits 00, 01, 10, 11, respectively.

In the following paragraphs, the two-step FFE construction is explained based on the PAM4 modulation. In PAM4 mode, the most significant bit (MSB) is fed into 2/3 of the segments and the least significant bit (LSB) is fed into 1/3 of the segments, i.e., the segment ratio for MSB:LSB is 2:1.

In one embodiment, the two-step FFE for PAM4 modulation can be implemented as follows:

(i) Choose a coarse FFE (can be pre-selected) with a given taps' weight and an always-enabled fine FFE. The resolution of the two-step FFE is determined by the always-enabled fine FFE. For example, as shown in FIG. 4B-4C, the chosen (pre-selected) coarse FFE have a given taps' weight, i.e., pre-cursor (1 bit), main-cursor (2 bits), post1-cursor (2 bits), post2-cursor (1 bit), which represents pre-cursor (×1), main-cursor (×3), post1-cursor (×3), and post2-cursor (×1) shown in FIG. 4A accordingly. In one embodiment, as indicated in FIG. 4B-4C, the always-enabled fine FFE (2 bits) contains 0, 1/4, 2/4 and 3/4 signal levels with 1/4 volt level spacing.

(ii) Maintaining the overall output impedance $Z_{out}$ to be equal to 50Ω to match with the impedance of the channels (or transmission lines). That means the overall resistance for the coarse and fine FFE, including the MSB and LSM branches, should keep a constant value. The total output signal impedance weight for the two-step FFE can be expressed as $$\Sigma(pre+main+post1+post2)=(1+3+3+1+3/4)$$

The resistance of a coarse FFE is set to be $(35/4)*3*R_{cal}$ (=150Ω), where the value 3 represent the counts for both MSB and LSB branches, which is 3937.55, for precise control the output impedance. The resistance for the always-enabled fine FFE can be composed of three segments with output impedance value 3937.5Ω*4, which is 15750Ω for 1/4 level, 3937.5Ω*4*(1/2), which is 7875Ω for 2/4 level, and 3937.5 Ω*4*(1/3), which is 5250Ω for 3/4 level, respectively. The multiple segments layout including a two-calibration-loop driver circuit with replica cell for each segment of the two-step FFE is illustrated in FIG. 4D.

Figure 4:
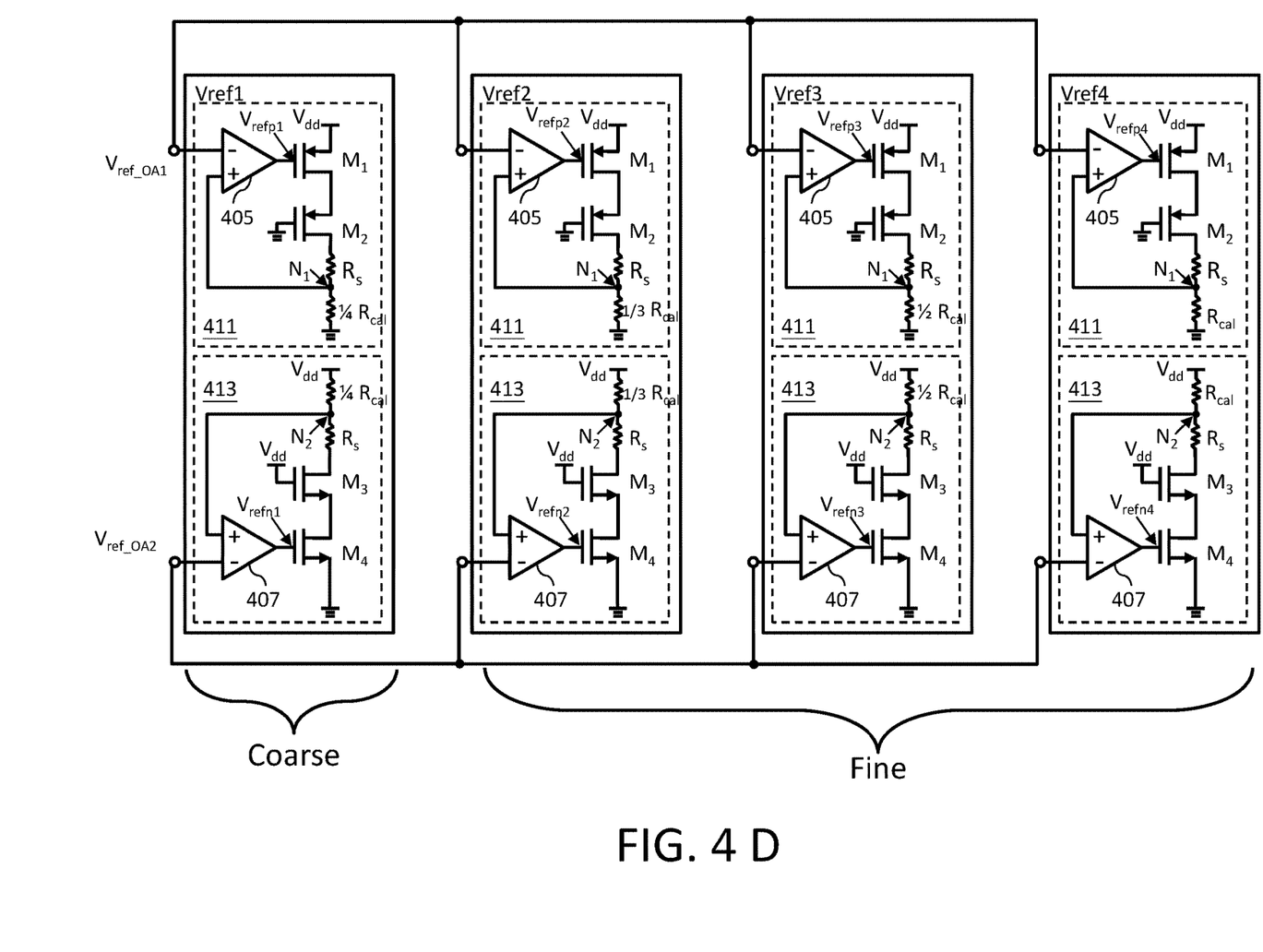
FIG. 4A illustrates a two-step feed-forward equalizer according to the present invention.
FIG. 4B-4C illustrates a schematic drawing for demonstrating the level spacing of the coarse FFE and fine FFE for PAM4 modulation according one embodiment of the present invention.
FIG. 4D illustrates the global calibration loops for the coarse FFE and fine FFE according one embodiment of the present invention
FIG. 4E illustrates the implementation of driver slices based on FIG. 4D.
Figure 4A:
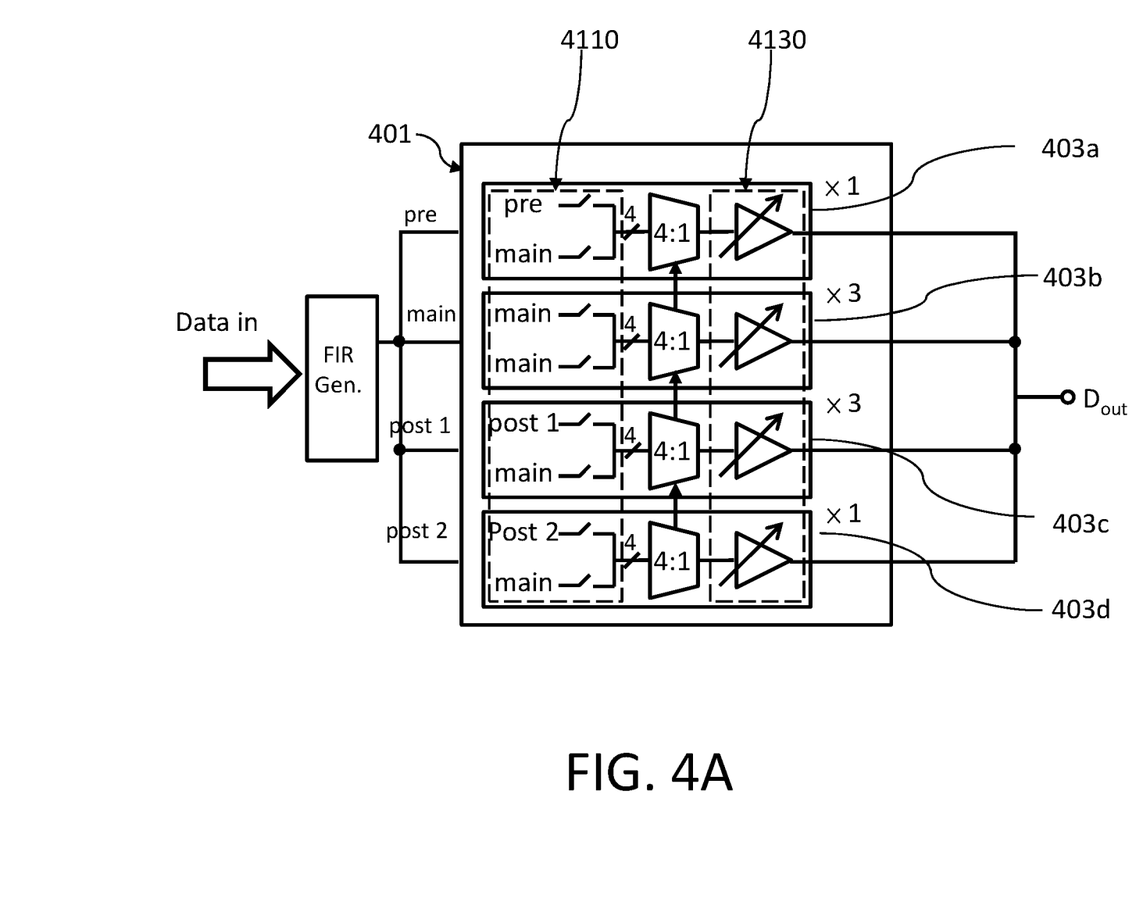
Figure 4B:
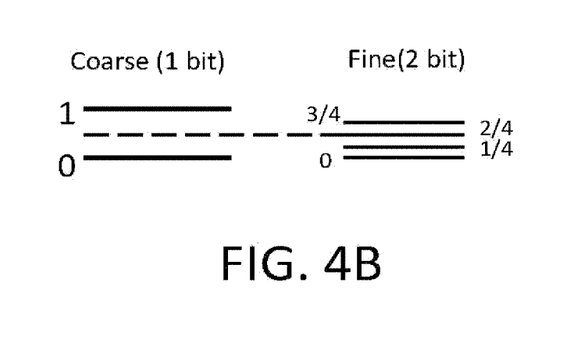
Figure 4C:
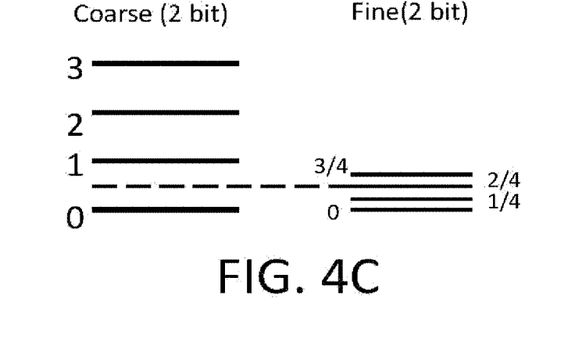

The global calibration loops for coarse FFE and fine FFE are shown in FIG. 4D, each segment includes a two-loop calibration circuit with replica cell. Each of the two-loop calibration circuit with replica cell including a first-loop circuit 411 and a second-loop circuit 413 can be coupled with voltage-mode transmitter driver circuit (output circuit of the transmitter) for equalizing the corresponding two branches of differential data signals ($D_{in}$, $\overline{D}_{in}$), details will be discussed in FIG. 4E. The operation principle of the two-loop calibration circuit has been explained, i.e. it acted as global impedance calibration circuit for the transmitter, in the section regarding to FIG. 3C in a great detail. Here, Vref1 segment represents a layout of Vref1 including a two-loop calibration circuit with a 1/4 $R_{cal}$ in series with $R_s$ in both the first sub-circuit 411 and the second sub-circuit 413, which is corresponding to the coarse FFE for 1 full level. Similarly, Vref2 segment represents layout including a two-loop calibration circuit with a 1/3 $R_{cal}$ in series with $R_s$ in both the first-loop calibration circuit 411 and the second-loop calibration circuit 413, which is corresponding to the fine FFE for 3/4 level. Vref3 segment represents layout including a two-loop calibration circuit with a 1/2 $R_{cal}$ in series with $R_s$ in both the first-loop calibration circuit 411 and the second-loop calibration circuit 413, which is corresponding to the fine FFE for 2/4 level. Vref4 segment represents layout including a two-loop calibration circuit with a $R_{cal}$ in series with $R_s$ in both the first-loop calibration circuit 411 and the second-loop calibration circuit 413, which is corresponding to the fine FFE for 1/4 level.

Figure 4E:
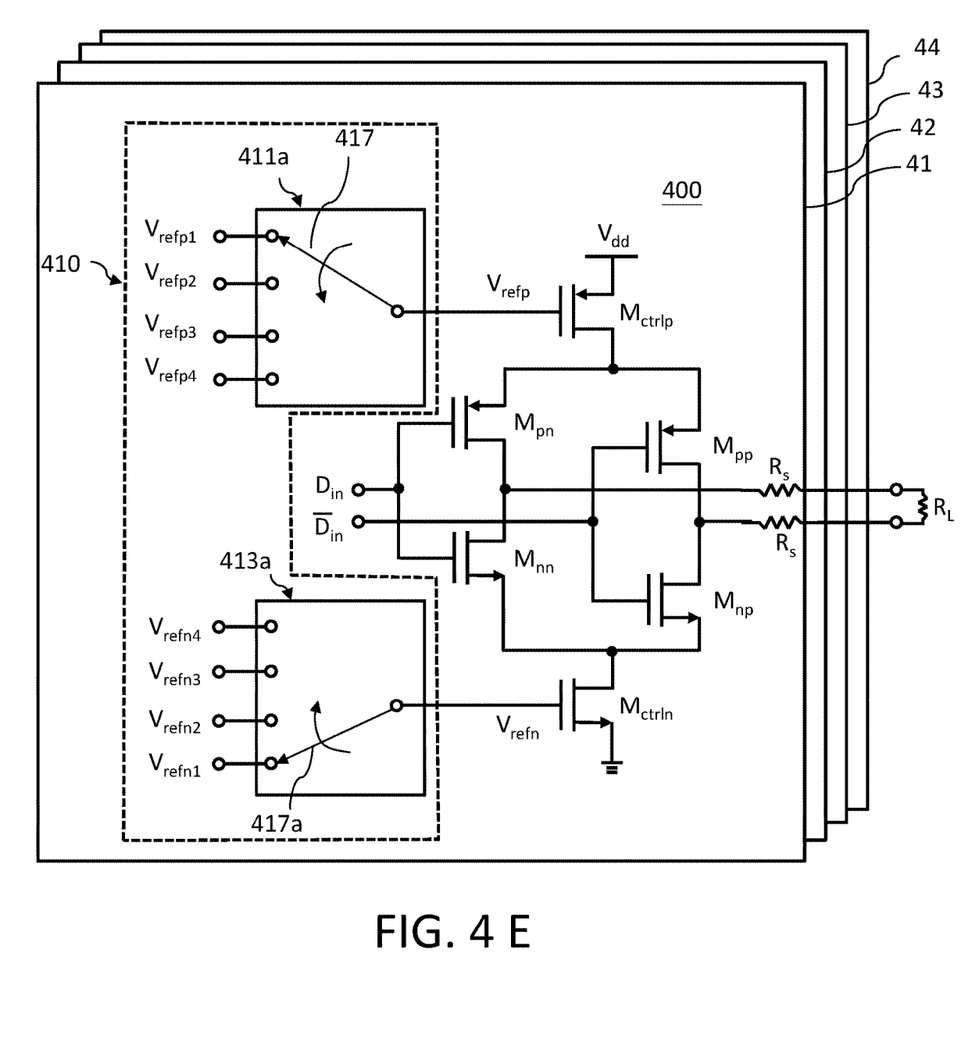

FIG. 4E shows the implementation of driver slices of transmitter. In this approach, the impedance of the voltage-mode transmitter driver circuit (output circuit of the transmitter) 400 can be adjusted by the bundled two-loop calibration circuit 410 (enclosed by dashed line). The two-loop calibration circuit 410 utilizes replica circuits 411a and 413a to control the impedance of the transmitter. The replica circuit 411a is composed of individual first-loop calibration circuit 411 of Vref1 to Vref4 segments assembled in parallel, while the replica circuit 413a is composed of individual second-loop calibration circuit 411 of Vref1 to Vref4 segments assembled in parallel. As a result, the resistor variations of the transmitter (TX) can be compensated or calibrated to match an on-chip resistor ($1/4R_{cal}$, $1/3R_{cal}$, $1/2 R_{cal}$ or $R_{cal}$) to an external resistor ($R_L$) by selecting (or enabling) an appropriate impedance compensation from at least one of the two-calibration-loop driver circuits from the (Vrefpi, Vrefni) terminal pairs, where i can be 1, 2, 3 or 4, to couple with the corresponding supply voltage terminals (Vrefp, Vrefn) of the voltage-mode TX driver circuit 400 through switches 417 and 417a. Each of driver slices 41, 42, 43 and 44 represents the voltage-mode transmitter driver circuit 400 coupled to one of the selected two-calibration-loop driver circuit terminal pairs, (Vrefp1, Vrefn1), (Vrefp2, Vrefn2), (Vrefp3, Vrefn3) or (Vrefp4, Vrefn4), respectively.

In this invention the configurability of the PAM4 transmitter taps together with the two-step FFE can supports a wide range of channel profiles while minimizing the number of segments.

Figure 5:
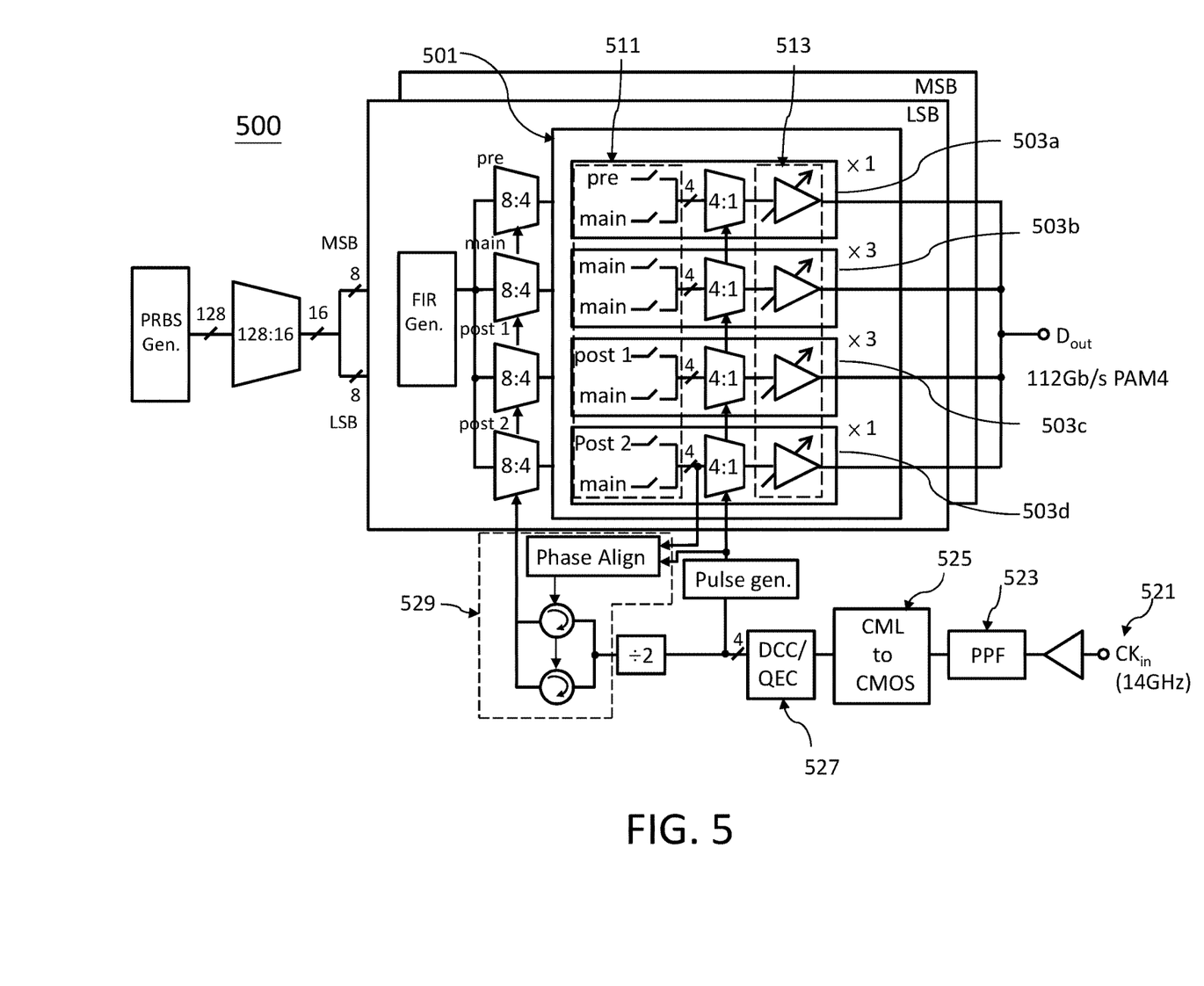
FIG. 5 illustrates an PAM4 transmitter architecture with a two-step FFE according to one embodiment of the present invention.

FIG. 5 illustrates a 112 Gb/s PAM4 transmitter architecture. In FIG. 5 the pseudo-random bit sequence (PRBS) generator sends 128 bits parallel data through a 128:16 multiplexer (MUX). The data is split into two 8-bits bundles (MSB and LSB) and fed into a FIR block to generate the pre-, main-, post1- and post2-cursor streams through four 8:4 serializers, respectively. These pre-, main-, post1- and post2-cursor streams are fed into an output stage 501 and are reconfigured into (pre-, main-), (main-, main-), (post1-, main-), and (post2-, main-) coarse FFE 511 follow by a 4:1 serializer into a fine FFE 513. An output stage 501 illustrates the output segments 503a, 503b, 503c and 503d, each output segment having a coarse 511 (for example, pre- or main-cursor in output segment 503a) and a fine FFE 513. The coarse FFE 511 and the fine FFE 513 are coupled through a 4:1 serializer to form a two-step FFE.

The transmitter incorporates a quarter rate clocking (14 GHz) 521, a poly-phase filter 523, a CIVIL to CMOS converter 525, a duty-cycle and quadrature error correction (DCC/QEC) circuit 527 with statistical phase error detection, and a phase align circuit 529 to produce re-timed signals at various stages of the data path, such as at the 8:4 serializers and the 4:1 serializers, for the transmitter.

The above mentioned preferred embodiment of the present invention illustrates the present invention rather than limiting the present invention. In a similar way, the two-step FFE construction for PAM4 modulation can also be applied to NRZ modulation.

As will be understood by persons skilled in the art, the foregoing preferred embodiment of the present invention illustrates the present invention rather than limiting the present invention. Having described the invention in connection with a preferred embodiment, modifications will be suggested to those skilled in the art. Thus, the invention is not to be limited to this embodiment, but rather the invention is intended to cover various modifications and similar arrangements included within the spirit and scope of the appended claims, the scope of which should be accorded the broadest interpretation, thereby encompassing all such modifications and similar structures. While the preferred embodiment of the invention has been illustrated and described, it will be appreciated that various changes can be made without departing from the spirit and scope of the invention.

What is claimed is:

1. A driver for a transmitter comprising:
   an output stage including a first equalizer and a second equalizer, coupled to an output circuit of the transmitter, being operable for receiving a plurality of differential input data streams to generate an equalized differential output signals;
   wherein the first equalizer and the second equalizer being coupled and configured to form a plurality of parallel driver segments, each driver segment having a calibration circuit, at least one of the calibration circuits been enabled to control the impedance of the output circuit, the plurality of differential input data streams are processed by the first and the second equalizer to shape the plurality of differential input data streams for compensating the channel loss, and
   wherein the first equalizer and the second equalizer are coupled in parallel to form a two-step feed-forward equalizer for the transmitter.

2. The driver for a transmitter of claim 1, wherein the first equalizer is a coarse feed-forward equalizer containing coarser signal segment levels.

3. The driver for a transmitter of claim 1, wherein the second equalizer is a fine feed-forward equalizer containing finer signal segment levels.

4. The driver for a transmitter of claim 1, wherein the calibration circuit is a two-loop calibration circuit including a first-loop calibration circuit and a second-loop calibration circuit.

5. The driver for a transmitter of claim 4, wherein the first-loop calibration circuit comprises:
   a first supply source, a first transistor, a second transistor with its gate coupled to a ground source, a first resistor, a second resistor, and a second supply source serially connected to provide a current path;
      a first operational amplifier with its output coupled to a gate of the first transistor, its inverting input coupled to a first reference bias, and its non-inverting input connected to a first node between the first resistor and the second resistor;
   the second-loop calibration circuit comprises:
   the first supply source, a third resistor, a fourth resistor, a third transistor with its gate coupled to the first supply source, a fourth transistor, and a third supply source serially connected to provide a current path, wherein the third resistor is the same as the second resistor and the fourth resistor is the same as the first resistor;
      a second operational amplifier with its output coupled to a gate of the fourth transistor, its inverting terminal coupled to a second reference bias, and its non-inverting input connected to a second node between the third resistor and the fourth resistor.

6. The driver for a transmitter of claim 5, wherein during the operation of the first-loop calibration circuit, a feedback loop is formed from the output of the first operational amplifier to the first transistor, to the second transistor, to the first resistor, to the first node, and back to the non-inverting input of the first operational amplifier to generate a bias voltage at the first node being about equal to the first reference bias coupled to the inverting input of the first operational amplifier.

7. The driver for a transmitter of claim 5, wherein during the operation of the second-loop calibration circuit, a feedback loop is formed from the output of the second operational amplifier to the fourth transistor, to the third transistor, to the fourth resistor, to the second node, and back to non-inverting input of the second operational amplifier to generate a bias voltage at the second node being about equal to the second reference bias coupled to the inverting input of the second operational amplifier.

8. The driver for a transmitter of claim 5, wherein the second supply source in the first sub-circuit and the third supply source the second sub-circuit are both set to be a ground source respectively.

9. The driver for a transmitter of claim 5, wherein the first reference bias for the first operational amplifier is set to be a value equal to three quarter of the value of the first supply source, while the second reference bias for the second operational amplifier is set to be a value equal to one quarter of the value of the first supply source.

10. The driver for a transmitter of claim 5, wherein the first, the second, the third, and the fourth transistor are respectively a PMOS, a PMOS, a NMOS and a NMOS transistor.

11. The driver for a transmitter of claim 1, wherein the output circuit having a first branch and a second branch, wherein the first branch is selectively activated according to the polarity of the plurality of differential input data streams to send the generated equalized differential output signals, and wherein the second branch is selectively activated according to the polarity of the plurality of differential input data streams to send the generated equalized differential output signals while the first branch is inactivated.

12. The driver for a transmitter of claim 11, wherein the first branch and the second branch are respectively composed of a first load transistor, a pair of drive transistors and a second load transistor in series to form a current loop for passing the data streams, wherein the first load transistor is a PMOS, the pair of drive transistors are a PMOS in series to a NMOS, the second load transistor is a NMOS.

13. A data transmitting system, comprising:
   a transmitter to receive an input binary signal, to process the input binary signal, and output the processed binary signal, wherein the input binary signal consisting of a plurality of differential input data streams;
   a transmitter circuit included in the transmitter having an output stage including a first equalizer and a second equalizer, coupled to an output circuit of the transmitter, being operable for receiving the plurality of differential input data streams to generate an equalized differential output signals;
   wherein the first equalizer and the second equalizer being coupled and configured to form a plurality of parallel driver segments, each driver segment having a calibration circuit, at least one of the calibration circuits been enabled to control the impedance of the output circuit, the plurality of differential input data streams are processed by the first and the second equalizer to shape the plurality of differential input data streams for compensating the channel loss;
   wherein the first and the second equalizer of the output stage are coupled in parallel to form a two-step feed-forward equalizer for the transmitter; and
   a re-timing clock providing a plurality of re-timed signal to the transmitter circuit.

14. The data transmitting system of claim 13, wherein the first equalizer is a coarse feed-forward equalizer containing coarser signal segment levels, the second equalizer is a fine feed-forward equalizer containing finer signal segment levels.

15. The data transmitting system of claim 13, wherein the calibration circuit is a two-loop calibration circuit including a first-loop calibration circuit and a second-loop calibration circuit.

16. The data transmitting system of claim 15, wherein the first-loop calibration circuit comprises:
   a first supply source, a first transistor, a second transistor with its gate coupled to a ground source, a first resistor, a second resistor, and a second supply source serially connected to provide a current path;
      a first operational amplifier with its output coupled to a gate of the first transistor, its inverting input coupled to a first reference bias, and its non-inverting input connected to a first node between the first resistor and the second resistor;
   the second-loop calibration circuit comprises:
   the first supply source, a third resistor, a fourth resistor, a third transistor with its gate coupled to the first supply source, a fourth transistor, and a third supply source serially connected to provide a current path, wherein the third resistor is the same as the second resistor and the fourth resistor is the same as the first resistor;
      a second operational amplifier with its output coupled to a gate of the fourth transistor, its inverting terminal coupled to a second reference bias, and its non-inverting input connected to a second node between the third resistor and the fourth resistor;

wherein the second supply source in the first-loop calibration circuit and the third supply source the second-loop calibration circuit are both set to be a ground source respectively, the first reference bias for the first operational amplifier is set to be a value equal to three quarter of the value of the first supply source, while the second reference bias for the second operational amplifier is set to be a value equal to one quarter of the value of the first supply source.

17. The data transmitting system of claim 16, wherein during the operation of the first-loop calibration circuit, a feedback loop is formed from the output of the first operational amplifier to the first transistor, to the second transistor, to the first resistor, to the first node, and back to the non-inverting input of the first operational amplifier to generate a bias voltage at the first node being about equal to the first reference bias coupled to the inverting input of the first operational amplifier, wherein the first, the second, the third, and the fourth transistor are respectively a PMOS, a PMOS, a NMOS and a NMOS transistor.

18. The data transmitting system of claim 16, wherein during the operation of the second-loop calibration circuit, a feedback loop is formed from the output of the second operational amplifier to the fourth transistor, to the third transistor, to the fourth resistor, to the second node, and back to non-inverting input of the second operational amplifier to generate a bias voltage at the second node being about equal to the second reference bias coupled to the inverting input of the second operational amplifier, wherein the first, the second, the third, and the fourth transistor are respectively a PMOS, a PMOS, a NMOS and a NMOS transistor.

* * * * *